United States Patent [19]

Yamada et al.

[11] 4,392,253

[45] Jul. 5, 1983

[54] PHASE LOCKED LOOP CIRCUIT

[75] Inventors: Takaaki Yamada; Yoshio Osakabe; Yukio Tsuda, all of Kanagawa, Japan

[73] Assignee: Sony Corporation, Tokyo, Japan

[21] Appl. No.: 220,112

[22] Filed: Dec. 24, 1980

[30] Foreign Application Priority Data

Dec. 29, 1979 [JP] Japan .................................. 54-170789

[51] Int. Cl.³ .......................... H04B 1/26; H03J 7/28; H03L 7/18
[52] U.S. Cl. .................................. 455/165; 331/1 A; 455/183
[58] Field of Search ............... 455/165, 183; 331/1 A, 331/4, 25, 178

[56] References Cited

U.S. PATENT DOCUMENTS 3,864,637  2/1975  Kanow .............................. 455/165
3,980,951  9/1976  Breeze et al. ...................... 455/183
4,065,720 12/1977  Pogue, Jr. .......................... 455/179

Primary Examiner—Marc E. Bookbinder
Attorney, Agent, or Firm—Lewis H. Eslinger; Alvin Sinderbrand

[57] ABSTRACT

A frequency synthesized receiver utilizes, as a local oscillator, a phase-locked circuit formed of a reference signal oscillator, a voltage controlled oscillator, a programmable divider, a phase comparator, and a low-pass filter. For tuning to a desired frequency, the dividing ratio of the programmable divider is controlled by an up/down counter connected in parallel with a shift register. The latter is supplied with a clock pulse signal and a binary coded selecting signal furnished from a micro computer. The selecting signal corresponds to a desired broadcast frequency. The up/down counter is caused by the micro computer to count up or down from the count value stored in the shift register, thereby causing the received frequency to rapidly sweep, at predetermined steps of, for example, 100 KHz.

12 Claims, 9 Drawing Figures

PHASE LOCKED LOOP CIRCUIT

BACKGROUND OF THE INVENTION

1. Field of the Invention

The present invention relates generally to a PLL (phase-locked loop) frequency synthesized receiver and is directed more particularly to a PLL frequency synthesized receiver which can shorten an up/down broadcast station selection time.

2. Description of the Prior Art

There are presently known frequency-synthesized receivers which use a phase-locked loop (PLL) circuit as a local oscillator circuit. The PLL circuit normally includes a programmable frequency divider whose dividing ratio determines the local oscillation frequency. In such a receiver, a station selection code is provided to correspond to a desired received frequency. This code is stored or generated in a control apparatus, which can be a microcomputer, and is supplied to a data register coupled with the programmable divider. The contents of the data register then determine the dividing ratio of the programmable divider to determine the local oscillator frequency and, hence, to determine the received frequency.

If it is desired to change the tuning of the receiver by continuously sweeping the local oscillation frequency up or down, the contents of the data register must be changed by unit steps to correspond, for example, to frequency changes of 100 KHz.

Unfortunately, each up or down step requires a rather involved operation and consumes an inordinate amount of time. This prevents the receiver from changing frequencies rapidly.

For example, to change the frequency by one increment of 100 KHz (i.e., to change the dividing ratio of the programmable divider by "1") the code stored in the control apparatus, which code has been converted to a 16-bit BCD signal to control the contents of the data register, is converted back to binary form, and then is incremented or decremented. Then the incremented or decremented code is converted again to a BCD signal and is transferred to the data register. As the code can be handled only on a bit-by-bit basis, this operation consumes a great deal of time. In the case of a received frequency change from one end of the frequency band to the other, this operation can be annoyingly long.

OBJECTS AND SUMMARY OF THE INVENTION

Accordingly, an object of the present invention is to provide a frequency synthesized receiver free from the defects encountered in prior art receivers.

Another object of the invention is to provide a frequency synthesized receiver in which the frequency dividing ratio of a programmable divider in a PLL circuit can be quickly varied up or down by an up-/down counter and a shift register coupled to each other to shorten the broadcast station selecting time.

In accordance with one embodiment of the present invention, a PLL circuit is provided which can serve as the local oscillator circuit of a frequency-synthesized receiver. Such as PLL circuit comprises a reference signal oscillator, a voltage controlled oscillator (VCO) providing an output oscillation signal whose frequency depends on an error signal applied thereto, a programmable divider connected to the VCO to divide down the output oscillating signal by a programmed dividing ratio, a phase comparator providing the error signal in accordance with the phase difference between the divided-down output signal and the output of the reference signal oscillator, and a data register supplied with a clock pulse signal and a selection signal, while can be a binary coded signal to produce a programming control signal to establish the dividing ratio of the programmable divider. An up/down counter is interposed between the data register and the programmable divider to latch the programming control signal therein and to selectively increment the same upwardly or downwardly to control the dividing ratio of the programmable divider.

Still other objects, features and advantages of the present invention will be apparent from the following descriptions taken in conjunction with the attached drawings throughout which like reference characters identify the same elements and parts.

DETAILED DESCRIPTION OF A PREFERRED EMBODIMENT

Figure 1:
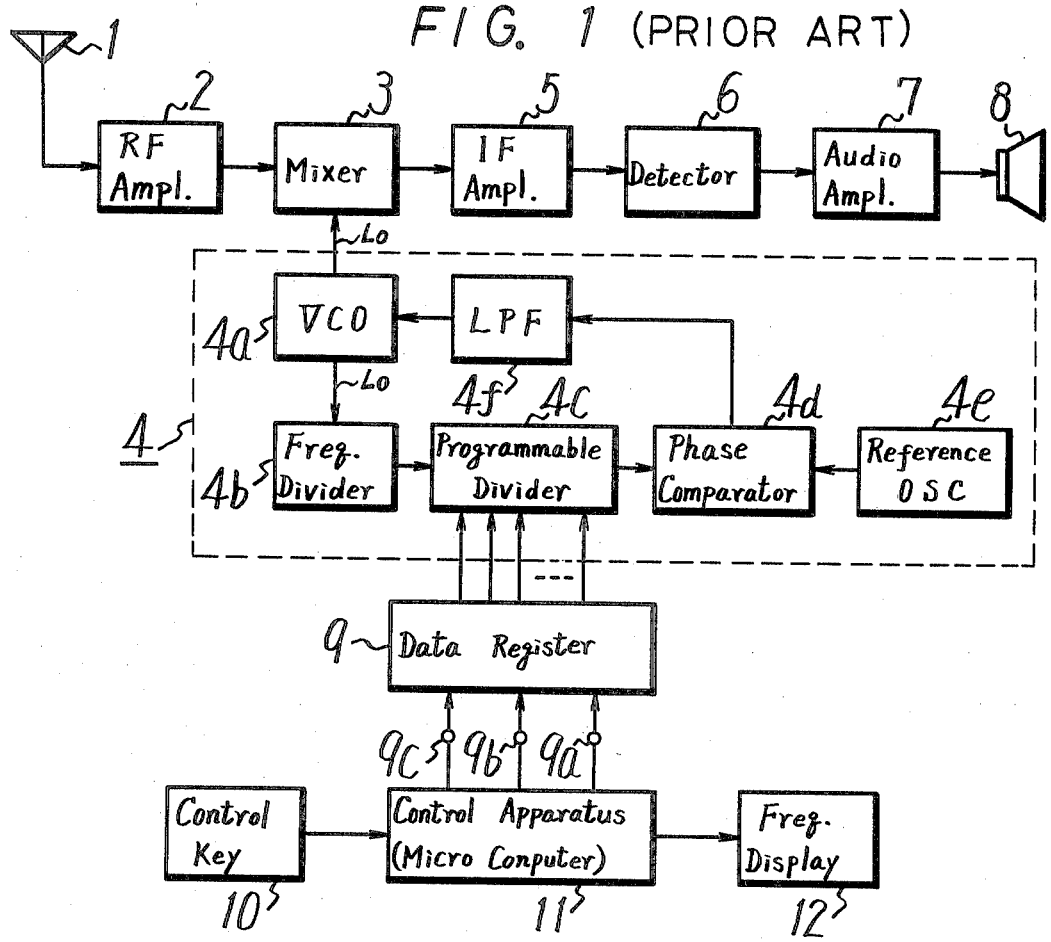
FIG. 1 is a block diagram showing a prior art synthesized receiver.

For background and to emphasize the advantages of this invention, a prior art frequency synthesized receiver is shown in FIG. 1. In this receiver, an antenna 1 receives a broadcast RF signal and then supplies the same through an RF (radio frequency) amplifier 2 to one input of a mixer circuit 3. Another input thereof is supplied with a local oscillation signal LO from a phase-locked loop local oscillator circuit 4. A voltage controlled variable frequency oscillator (VCO) 4a thereof generates the local oscillation signal LO. The output signal from the mixer circuit 3 is supplied as an IF (intermediate frequency) signal to an IF amplifier 5, and thence to a detector circuit 6. An audio signal is obtained at the output side of the detector circuit 6 and is fed to a low frequency or audio amplifier 7, and the output signal therefrom is fed to an audio transducer 8 to provide audio sound.

The local oscillation signal LO from the PLL local oscillator circuit 4 is also applied to a first frequency divider, i.e., a pre-scaler 4b, which frequency-divides the signal LO by 100. The divided signal therefrom is applied to a programmable frequency divider 4c. The frequency dividing ratio of the programmable divider 4c is controlled in response to the selection of the desired broadcast station frequency by means of a station selection code applied thereto from a data register 9. The latter normally consists of a shift register and a latch circuit. The divided-down output signal from the programmable divider 4c is applied to a phase comparator 4d at one input terminal thereof and a reference oscillator 4e provides a reference frequency signal to another input terminal thereof. The phase comparator 4d produces an error voltage corresponding to the phase difference between the above two signals. The output signal from the phase comparator 4d is supplied through a low-pass filter 4f to the local oscillator 4a and the filtered error signal controls the VCO 4a. Thus, the latter produces the local oscillation signal LO as a stable oscillating signal whose frequency is a function only of the frequency dividing ratio of the programmable divider 4c.

Figure 2:
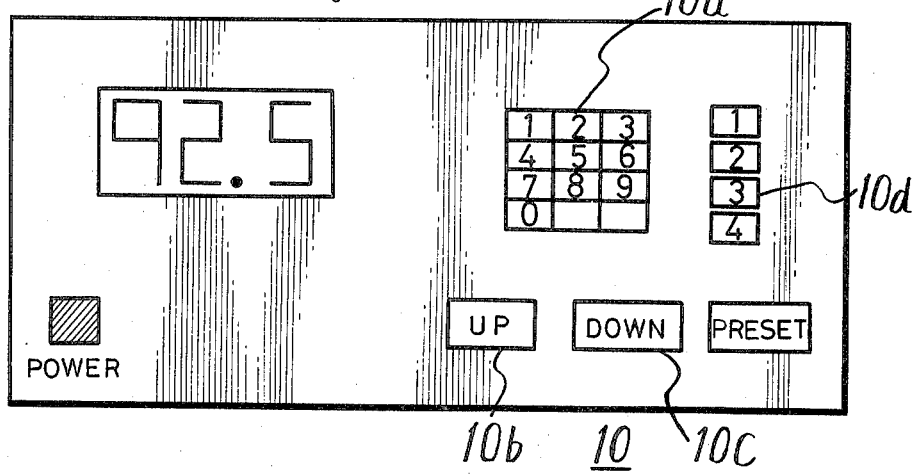
FIG. 2 is a front view showing the front panel of a PLL synthesized receiver to which this invention is favorably applied.

As better shown in FIG. 2, an operation or control key assembly 10 consists of ten numerical keys 10a, an up-scan key 10b, a down-scan key 10c, preset selection keys 10d for reading out selection signals corresponding to the broadcast stations previously preset in a memory (not shown), as well as other keys for selecting various functions. A control apparatus 11, here constituted by a microcomputer and associated peripheral devices, supplies a clock signal to a clock signal input terminal 9a of the data register 9, supplies the broadcast station selection signal, in response to the operation of the control key 10, to a data input terminal 9b of the data register 9, and furnishes a latch signal to a latch signal input terminal 9c of the data register 9. The control apparatus 11 also supplies a display signal to a frequency display device 12 on which the received frequency and other parameters of interest are displayed.

With the prior-art frequency synthesized receiver constructed as shown in FIG. 1, a preset selection operation is carried out by depressing a selected one of the preset keys 10d corresponding to the desired broadcast station so that a station control signal corresponding to the desired broadcast station frequency is fetched out of memory. Then the control apparatus 11 applies the station selection signal, which can be a BCD (binary coded decimal) signal consisting of four four-bit words (i.e., 16 bits), which is in synchronism with the clock signal, to the data register 9. The shift register of data register 9 temporarily stores the station selection signal. Thereafter, this station selection signal is transferred to the latch circuit of the data register 9 in response to the latch signal applied thereto from the control apparatus 11. Then, the station selection signal is fed to the programmable divider 4c in the PLL local oscillator circuit 5 to set its frequency dividing ratio to correspond to the station selection signal. Consequently, the VCO 4a provides the local oscillation signal LO at the appropriate frequency to receive the desired broadcast station.

If the receiving frequency is sequentially varied by increments of, for example, 100 KHz (corresponding to unit increments in the dividing ratio of the programmable divider 4c) to achieve an upward or downward continuous station selection operation, a BCD signal of 16 bits is applied from the control apparatus 11 to the register 9. Generally, the first 12 bits are the data for controlling the frequency dividing ratio of the programmable divider 4c (corresponding to three significant decimal of the frequency) and the remaining 4 bits are the data for changing over the comparing frequency and the input signal. This 16-bit signal is temporarily stored in the shift register of the data register 9 in synchronism with the above-mentioned clock signal and then is latched by the above-mentioned latch signal which is applied to the data register 9 after 16 clock signals. Thus, a time of 17 clock signals is required for each step of 100 KHz. If a clock signal period of 2 μsec is assumed, this corresponds to 34 82 sec for each step, and the station selection time can become rather long.

Further, when the up/down control of the control apparatus (micro-computer) 11 is carried out by means of BCD signals, a BCD-to-binary conversion becomes necessary, which results in additional lengthening of station selection time.

As described above, with the prior art synthesized receiver shown in FIG. 1, if the receiving frequency is successively incremented by steps of, for example, 100 KHz to continuously carry out an upward or downward station selection operation, it is necessary that at every time that the receiving frequency is incremented by one step, the receiving frequency is converted into a binary code to correspond to a revised station selection signal, this revised station selection signal, in binary code, is stored in the data register 9, and then the station selection signal is fed as a binary code from the data register 9 to the programmable divider 4c to change the frequency dividing ratio thereof by a step that can, for example, be "1." This continuous station selection operation consumes an unduly long time. Consequently, station selection can not be carried out rapidly.

Figure 3:
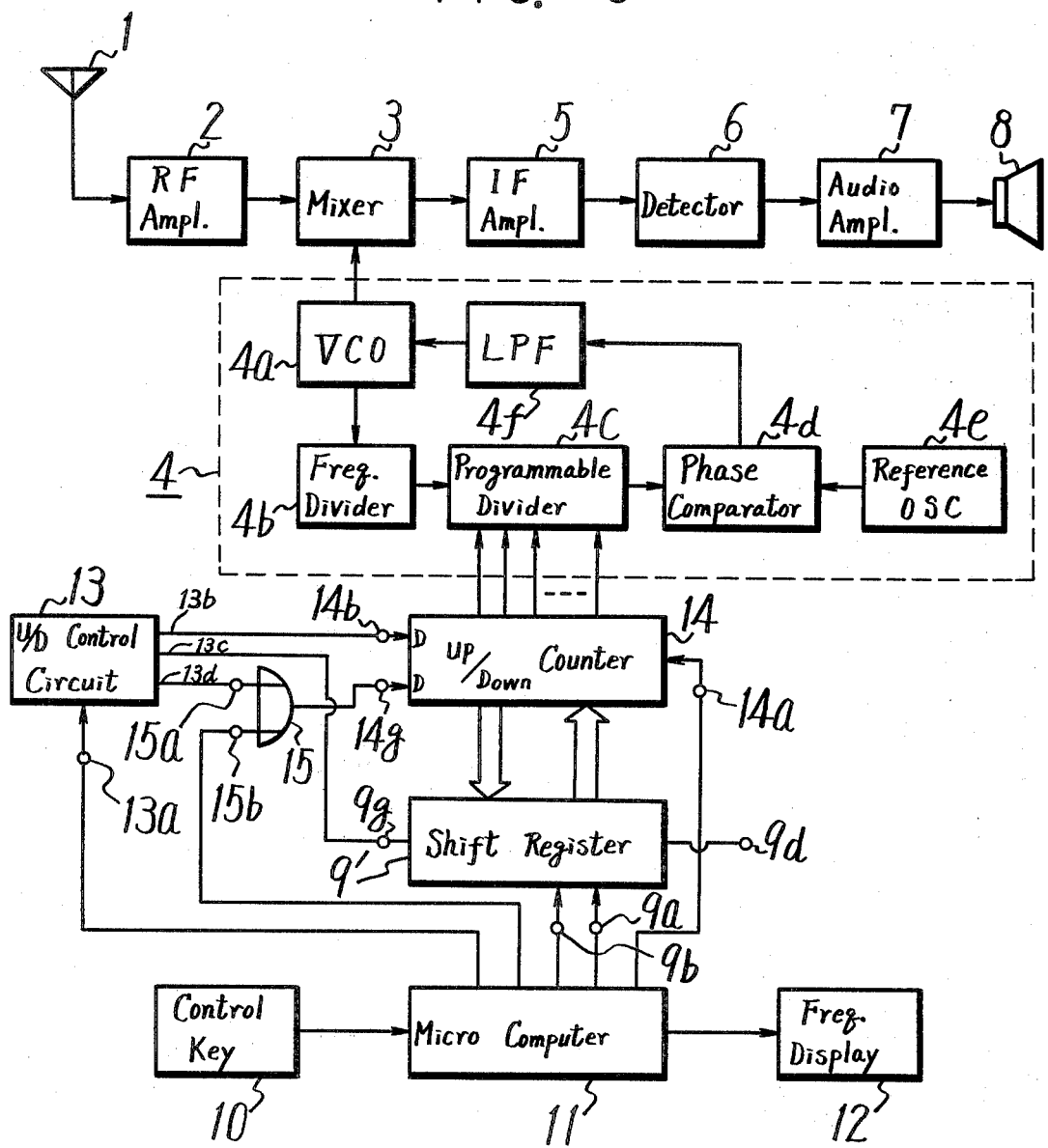
FIG. 3 is a block diagram showing an example of a frequency synthesized receiver that includes a local oscillator circuit embodying this invention.

Turning now to FIG. 3, an example of the frequency synthesized receiver embodying a phase-locked loop circuit according to the present invention will now be described. In FIG. 3, the parts and elements corresponding to those of FIG. 1 are identified with the same reference numerals and a detailed description thereof is omitted.

The broadcast station selection signal and clock signal are supplied from the control apparatus 11 to a shift register 9', and an up/down change-over signal is also fed from the control apparatus 11 to an up/down control circuit 13 through a change-over signal input terminal 13a thereof. The control apparatus 11 is here shown as a micro-computer. The up/down control circuit 13 has a first output terminal 13b which supplies an up-/down control signal to an up/down control signal input terminal 14b of an up/down counter 14 to set it into an up or a down state. A second output terminal 13c of the up/down control circuit 13 supplies a first gate signal to a gate signal input terminal 9g of the shift register 9', and a third output terminal 13d thereof supplies a second gate signal to one input terminal 15a of an OR circuit 15 which is supplied at its other input terminal 15b with the latch signal from the control apparatus 11. The output signal from the OR circuit 15 is fed, as a gate signal, to a gate signal input terminal 14g of the up/down counter 14. In this case, when the gate signal is supplied from the second output terminal of the up/down control circuit 13 to the gate signal input terminal 9g of the shift register 9', the counted content of the up/down counter is transferred without change to the shift register 9'. Further, when the second gate signal from the third output terminal of the up/down control circuit 13 is fed to the input terminal 15a of the OR circuit 15 or the latch signal from the control apparatus 11 is fed to the other input terminal 15b of the OR circuit 15 so that the gate signal from the output terminal of the OR circuit is fed to the gate signal input terminal 14g of the up/down counter 14, the stored content in the shift register 9' is transferred without change to the up/down counter 14. The control apparatus 11 supplies a clock signal to a clock signal input terminal 14a of the up/down counter 14 to cause it to count up or down, as appropriate. The signal applied to the up/down control signal input terminal 14b controls the counting direction to be up or down. Then, the counted contents obtained at the respective output terminals of the up/down counter 14 are supplied as the station selection signals to the programmable divider 4c to control its frequency dividing ratio according to the counted contents. The remaining construction of the example of FIG. 3 is substantially the same as that of the prior art example shown in FIG. 1.

According to the present invention constructed as above, when the station selection signal corresponding to a desired broadcast station is read out from the stored station selection signals, which are previously preset in the memory in correspondence with the desired broadcast stations, to receive one of the desired broadcast stations, one of the preset selection keys 10d corresponding to the desired broadcast station is actuated to supply the signal to the control apparatus 11. Then, the control apparatus 11 supplies the clock signal to the shift register 9' which is also furnished with the station selection signal corresponding to the desired broadcast station and is supplied from the memory. Thus, the station selection signal is temporarily stored in the shift register 9'. Thereafter, the latch signal is fed from the control apparatus 11 to the OR circuit 15 through its input terminal 15b to transfer the station selection signal stored in the shift register 9', without modification, to the up/down counter 14. The station selection signals appearing at the respective output terminals of the up/down counter 14 are applied to the programmable divider 4c in the PLL circuit 4 to make its frequency dividing ratio appropriate to correspond to the station selection signal. Then, the oscillation frequency of the local oscillation signal LO from the VCO 4a is varied to receive the desired broadcast station.

The receiving frequency can be sequentially increased or decreased by steps 100 of KHz to carry out a continuous station selecting operation. When it is desired to change the direction of scan of the station selection operation from the up-scan made to the down-scan mode (or from the down-scan to the up-scan mode), the up-scan key 10b (or down-scan key 10c) shown in FIG. 2 is actuated to supply the respective signal to the control apparatus 11. Then, a change-over signal (FIG. 4A) for changing over the scan direction from the up-scan to the down-scan mode (or from the down-scan to the up-scan mode) is supplied at a time $t_1$ from the control apparatus 11 to the change-over signal input terminal 13a of the up/down control circuit 13. At a subsequent time $t_2$, the first gate signal shown in FIG. 4B is supplied from the second output terminal of the up/down control circuit 13 to the gate signal input terminal 9g of the shift register 9' to transfer the counted content of the up/down counter 14 to the shift register 9'. Further, at a next time $t_3$, the up (or down) control signal shown in FIG. 4C is supplied from the first output terminal of the up/down control circuit 13 to the control signal input terminal 14b of the up/down counter 14 to set the same to the up-scan (or down-scan) mode. At the same time, the second gate signal shown in FIG. 4D is supplied from the third output terminal of the up/down control circuit 13 to the input terminal 15a of the OR circuit 15 which in turn supplies the gate signal to the gate signal input terminal 14b of the up/down counter 14. As a result, the contents of the shift register 9' are transferred to the up/down counter 14. At a subsequent time $t_4$, the clock signal shown in FIG. 4E is supplied from the control apparatus 11 to the clock signal input terminal 14a of the up/down counter 14 to increase or decrease its counted contents successively by, for example, "1." This results in a successive 100 KHz change in signal LO, and a similar change in the received station frequency. Accordingly, the programmable divider 4c of the PLL circuit 4 is supplied from the output terminals of the up/down counter 14 with appropriate station selection signals to successively change the receiving frequencies by steps of 100 KHz. Thus, the frequency dividing ratio of the programmable divider 4c is varied successively and the oscillation frequency of the local oscillation signal LO is successively varied to achieve the continuous station selection operation.

Figure 4A:
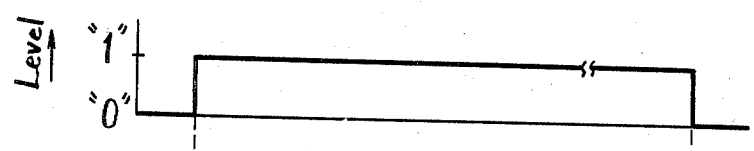
FIGS. 4A to 4E are time charts used to explain the operation of the example shown in FIG. 3.
Figure 4B:
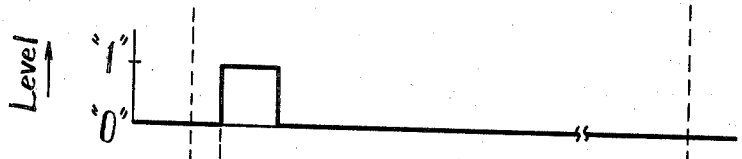
Figure 4C:
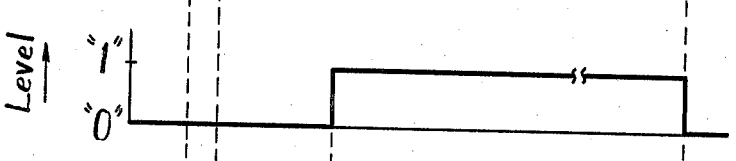
Figure 4D:
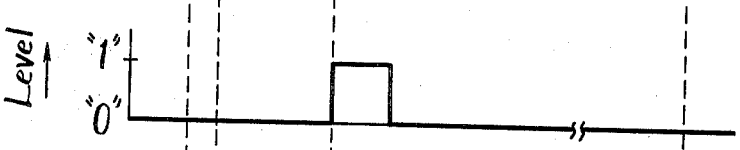
Figure 4E:
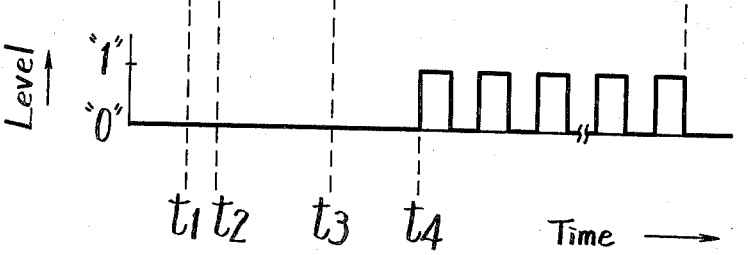

In the case that the selection operation is repeated from the up-scan to the up-scan mode (or from the down-scan to the down-scan mode), the up/down change-over signal shown in FIG. 4A is not supplied at the time $t_1$ from the control apparatus 11 to the change-over signal input terminal 13a of the up/down control circuit 13. Thus, at the times $t_2$ and $t_3$ the counted contents of the up/down converter 14, controlled by the output signal from the up/down control circuit 13, is not transferred to the shift register 9' and the state of the up/down counter 14 is not changed to transfer the content of shift register 9' to the up/down counter 14. As a result, from the time $t_4$ the clock signal shown in FIG. 4E is continuously fed from the control apparatus 11 to the clock signal input terminal 14a of the up/down counter 14 to successively and rapidly increase or decrease its counted content.

As described above, according to the present invention, the up/down counter 14 is interposed between the shift register 9' and the programmable divider 4c of the PLL local oscillator circuit 4, and the station selection signal, which controls the frequency dividing ratio of the programmable divider 4c, is fed thereto from the up/down counter 14. Therefore, when the receiving frequency is successively varied up or down by the step of, for example, 100 KHz to carry out a continuous station selection operation, such operation can be performed rapidly by increasing or decreasing only the counted contents of the up/down counter 14.

Further, according to this embodiment of the present invention, the counted contents of the up/down counter 14 is transferred without modification to the shift register 9' in accordance with the up/down changeover signal applied to the input terminal 13a of the up/down control circuit 13 from the control apparatus 11. As a result, if a check terminal 9d, used to check the data stored in the shift register 9', is provided on the shift register 9', the counted contents of the shift register 9' can be obtained from the check terminal 9d at any time, and the present counted contents in the up/down counter 14 can be used to generate a display of the received frequency. Further, since according to this invention it becomes unnecessary to store the increase and decrease of the counted contents at every step, the data storage space in the control apparatus 11 can be kept to a minimum or saved for other functions.

Throughout this discussion the term "incrementing" is used generally to cover both counting up and counting down.

Figure 5:
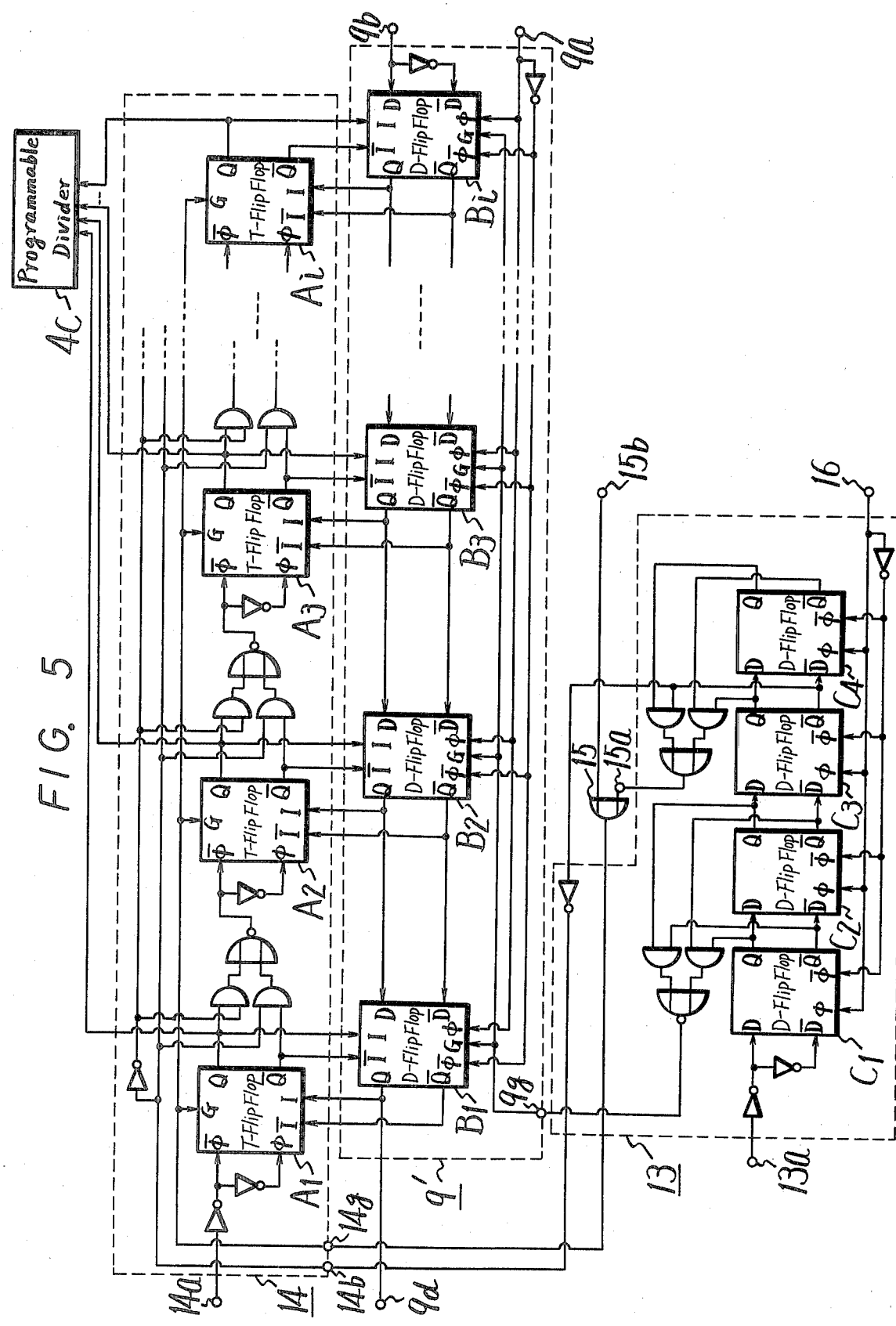
FIG. 5 is a schematic circuit diagram showing a practical example of a part of the embodiment of the invention shown in FIG. 3.

A practical example of the shift register 9', the up/down control circuit 13 and the up/down counter 14 of the frequency synthesized receiver according to the invention is disclosed in FIG. 5, in which the parts corresponding to those of FIG. 3 are identified with the same reference numerals and a detailed description thereof is omitted.

In FIG. 5, $A_1, A_2, A_3, \ldots A_i$ are T-type (trigger-type) flip-flop circuits which form the up/down counter 14; $B_2, B_2, B_3, \ldots B_i$ are D-type flip-flop circuits which form the shift register 9'; and $C_1, C_2, C_3$, and $C_4$ are D-type flip-flop circuits which form the up/down control circuit 13. The clock signal input terminal 16 is coupled to each of the D-type flip-flop circuits $C_1$ to $C_4$, and the clock signal input terminal 9a is coupled to each of the D-type flip-flop circuits $A_1$ to $A_i$.

While one embodiment of this invention is illustrated hereabove, it will be apparent that many modifications and variations could be effected therein by one skilled in the art without departing from the spirit or scope of the present invention, which is to be measured by the appended claims.

We claim as our invention:

1. A phase-locked loop circuit comprising:
   reference signal oscillator means providing a reference oscillating signal;
   voltage controlled oscillator means having an output providing an output oscillating signal whose frequency depends on an error signal applied thereto;
   programmable divider means connected to the output of said voltage controlled oscillator means for providing a divided-down signal, having a programmable dividing ratio and having a control terminal for receiving a programming control signal for programming the dividing ratio thereof;
   phase comparator means supplied with said reference oscillating signal and said divided-down signal and an output providing said error signal in response to the phase difference therebetween;
   data register means supplied with a clock pulse signal and a selection signal in synchronism with the clock pulse signal for providing said programming control signal from an output thereof; and
   up/down counter means coupled between the output of said data register means and the control terminal of said programmable divider means to latch the programming control signal therein, and to selectively increment the same to control the dividing ratio of said programmable divider means.

2. A phase-locked loop circuit according to claim 1, in which said clock pulse signal and said selecting signal are supplied from a micro-computer to said data register means.

3. A phase-locked loop circuit according to claim 1, further comprising up/down control circuit means to control the direction of counting of said up/down counter means and to coordinate the operation of the latter with that of said register means.

4. A phase-locked loop circuit according to claim 3, in which said up/down control circuit means is supplied with an up/down change-over signal and in response thereto produces a first control signal supplied to said up/down counter means to control the counting direction thereof and to condition the same to increment the count value thereof in response to a further clock pulse signal; a second control signal supplied to said data register means to transfer the programming control signal contained in said up/down counter means to said data register means; and a third control signal supplied to said up/down counter means to transfer the programming control signal stored in said data register means to said up/down counter means.

5. A phase-locked loop circuit according to claim 4, in which said first control signal is delayed for a predetermined time with respect to said second control signal so that said up/down counter means is changed over from one of an up-counting mode and a down-counting mode to the other thereof after the programming control signal contained in said up/down counter means is transferred to said data register means and before the counting operation thereof is started in response to said further clock pulse signal.

6. A phase-locked loop circuit according to claim 4; in which said data register means includes a data check terminal providing the contents of said data register means.

7. A phase-locked loop circuit according to claim 6; further comprising display means coupled to said data clock terminal for displaying a value corresponding to the contents of said data register means.

8. A phase-locked loop circuit according to claim 1; wherein said selection signal is provided to said data register means as a binary coded data signal.

9. A radio receiver comprising means for receiving a broadcast signal, a local oscillator for providing a local oscillator signal, mixer means for mixing the received broadcast signal with said local oscillator signal to produce a IF signal, and detector means for processing the IF signal to produce output information, wherein said local oscillator is formed of a phase-locked loop circuit including reference oscillator means providing a reference signal; voltage controlled oscillator means having an output providing said local oscillator signal whose frequency depends on an error signal applied thereto; programmable divider means coupled to the output of said voltage controlled oscillator means providing a divided-down version of the local oscillator signal at an output thereof, having a programmable dividing ratio, and having a control terminal for receiving a programming code for programming the dividing ratio thereof; phase comparator means supplied with the reference signal and the divided-down version of the local oscillator signal and providing said error signal in response to the phase difference therebetween; data register means supplied with a clock pulse signal and a selection signal in synchronism with the clock pulse signal for providing said programming control signal from an output thereof; and up/down counter means coupled between the output of said register means and the control terminal of said programmable divider means to latch the programming control signal therein and to selectively increment the same to control the dividing ratio of said programmable divider means.

10. A radio receiver according to claim 9; further comprising digital control apparatus for providing said selection signal, said clock pulse signal, and an up/down control signal for controlling the incrementing of the programming control signal by said up/down counter means.

11. A radio receiver according to claim 10; further comprising a control key arrangement coupled to said digital control apparatus to selectively establish the selection signal corresponding to a desired frequency, and to selectively establish an up-counting state and a down-counting state wherein said up/down counter means counts up and down, respectively.

12. A radio receiver according to claim 9, wherein a unit increment of said up/down counter means corresponds to a frequency change of approximately 100 KHz in said local oscillator signal.

* * * * *